United States Patent
Watanabe et al.

(10) Patent No.: US 6,365,921 B1
(45) Date of Patent: Apr. 2, 2002

(54) GALLIUM-NITRIDE-BASED SEMICONDUCTOR LIGHT EMITTING DEVICE AND FABRICATION METHOD

(75) Inventors: Atsushi Watanabe; Toshiyuki Tanaka; Hiroyuki Ota, all of Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/593,144

(22) Filed: Jun. 14, 2000

(30) Foreign Application Priority Data

Jun. 15, 1999 (JP) .......................................... 11-167986

(51) Int. Cl.[7] .............................................. H01L 21/00
(52) U.S. Cl. ........................... 257/97; 257/200; 257/94; 257/96
(58) Field of Search .............................. 257/94, 96, 97, 257/200; 438/47

(56) References Cited

U.S. PATENT DOCUMENTS

| | | | |
|---|---|---|---|
| 5,886,367 A | * | 3/1999 | Udagawa |
| 5,927,995 A | * | 7/1999 | Chen et al. |
| 6,072,197 A | * | 6/2000 | Horino et al. |
| 6,100,545 A | * | 8/2000 | Chiyo et al. |
| 6,130,446 A | * | 10/2000 | Takeuchi et al. |

FOREIGN PATENT DOCUMENTS

| | | | |
|---|---|---|---|
| JP | 10051073 A | * | 2/1998 |
| JP | 11054796 A | * | 2/1999 |

* cited by examiner

Primary Examiner—George Fourson
Assistant Examiner—Thanh Pham
(74) Attorney, Agent, or Firm—Sughrue Mion, PLLC

(57) ABSTRACT

A GaN-based semiconductor light emitting device is provided that has superior light emitting characteristics by controlling occurrence of a threading dislocation and keeping the flatness of a film GaN-based semiconductor light emitting device fabrication method comprises forming steps of at least forming an undoped gallium-nitride underlying layer on a low-temperature buffer layer while keeping the pressure in a reactor at a value close to atmospheric pressure.

17 Claims, 6 Drawing Sheets

GALLIUM-NITRIDE-BASED SEMICONDUCTOR LIGHT EMITTING DEVICE AND FABRICATION METHOD

BACKGROUND OF THE INVENTION

1. Field of the Invention

The present invention relates to a gallium-nitride-based semiconductor light emitting device and a fabrication method thereof.

2. Description of the Related Art

A GaN-based semiconductor light emitting device using a gallium-nitride-based compound is a short wavelength semiconductor device used in the wave band of about 300 to 500 nm.

The GaN-based semiconductor light emitting device is fabricated by using the metal-organic chemical vapor deposition method (hereafter referred to as MOCVD method). The MOCVD method is a film forming method of introducing a plurality of source gases into a reactor to make the gases vapor-phase-react on one another at a predetermined temperature and depositing an obtained compound on a substrate. By forming a film while changing species of source gases or component ratios of the source gases, it is possible to obtain a multilayer film made of different compounds or compounds with different component ratios. A GaN-based semiconductor light emitting device is obtained by setting a temperature in the reactor to 900 to 1100° C., properly using an organic metal such as trimethyl-gallium (hereafter referred to as TMG) or trimethyl-aluminum (hereafter referred to as TMA), or ammonia ($NH_3$) as a source gas, thereby forming a single crystal layer of a GaN-based compound semiconductor such as $(Al_xGa_{1-x})_{1-y}In_yN$ ($0 \leq x \leq 1$, $0 \leq y \leq 1$) on a substrate crystal.

The light emitting characteristic of the obtained device is influenced by the density of line defects, that is, the density of threading dislocations in a crystal. Because a threading dislocation creates a position where no light is emitted, it causes the light emitting characteristic to deteriorate. The threading dislocation appears when a physical misfit between a substrate crystal and a single crystal layer deposited on the substrate crystal is too large. For example, the threading dislocation is caused by the difference in lattice constant or crystal structure or the difference in thermal expansion coefficient. Therefore, it is preferable that a substrate material is the same as that of a single crystal layer to be formed on the substrate. In the case of a GaN-based semiconductor light emitting device, it is preferable to use a GaN single crystal for a substrate. However, it is very difficult to obtain a large GaN single crystal usable as a substrate. Therefore, for example, use of a semiconductor single crystal such as gallium arsenide (GaAs) as a substrate is also considered. However, because the temperature in an MOCVD reactor when forming a GaN single crystal multilayer film to be formed on the substrate ranges between 900 and 1100° C., the above semiconductor single crystal is physically unstable in this temperature range. Therefore, sapphire which is physically stable even at a high temperature has been used so far as a substrate, but the lattice constant of sapphire and that of GaN are different from each other by about 14%.

A two-stage film forming method is a method for forming a multilayer film so as to moderate the misfit of the lattice constant. The two-stage film forming method is a method of forming a buffer layer on a substrate at a temperature lower than a conventional temperature and forming a single crystal multilayer film on the buffer layer similarly to a conventional method.

As shown in FIG. 1, a low-temperature buffer layer 102 made of aluminum nitride (AlN) or GaN is formed on a sapphire substrate 101. The low-temperature buffer layer 102 is formed by setting the temperature in an MOCVD reactor at 400 to 600° C. After the low-temperature buffer layer 102 is formed, the temperature in the MOCVD reactor is raised to 900 to 1100° C. and a semiconductor single crystal layer represented by $(Al_xGa_{1-x})_{1-y}In_yN$ ($0 \leq x \leq 1$, $0 \leq y \leq 1$) is successively formed. A GaN underlying layer 103, n-type semiconductor layer 104, n-type cladding layer 105, active layer 106, p-type cladding layer 107, and p-type contact layer 108 are formed on the low-temperature buffer layer 102 in the stated order. A semiconductor light emitting device is fabricated by forming a p-side electrode 109 on the p-type contact layer 108 and an n-side electrode 110 on the n-type semiconductor layer 104.

The initial GaN crystal nuclei of the GaN underlying layer 103 deposited on the low-temperature buffer layer 102 grow on a plane (1 -1 0 1) and a plurality of high-order planes nearby the plane (1 -1 0 1). Therefore, the nuclei three-dimensionally grow like islands in directions parallel with and vertical to a plane of a substrate. When three-dimensional crystal growth progresses, islands collide with each other and are combined into one body and a high-order growth plane changes into the plane (1 -1 0 1) and another stable plane (0 0 0 1). Because Ga atoms reaching the plane (0 0 0 1) migrate on the surface of the plane (0 0 0 1) and are captured into the plane (1 -1 0 1), the growth rate of the plane (0 0 0 1) is very small compared to that of the plane (1 -1 0 1) and only the plane (0 0 0 1) remains as a growth plane. Thus, the growth plane two-dimensionally grows only in the direction that is vertical to the substrate plane and a film is flattened.

In the process of change from three-dimensional growth to two-dimensional growth, when the pressure in a reactor under film formation is low, the density of crystal nuclei produced is high because of the high diffusion rate of the precursor material and change to two-dimensional growth quickly occurs and thereby, a film is flattened. In this case, because a line defect density increases proportionally to the density of crystal nuclei, the obtained GaN underlying layer 103 has a high threading dislocation density.

However, when the reactor has a high pressure almost equal to atmospheric pressure, the density of crystal nuclei produced is low because of the low diffusion rate of the precursor material and the initial crystal nuclei grows to a large island after competition among islands due to selective growth and changes to two-dimensional growth. Therefore, the threading dislocation density of the obtained GaN underlying layer 103 decreases.

As shown in FIGS. 2 and 3, when a crystal nucleus grows to a large island and then changes to two-dimensional growth, a large pit 103a constituted of the plane (1 -1 0 1) easily occurs at a combined portion because islands are slowly combined with each other. Because supply of the precursor material into the deeper part of the pit 103a is reduced, it becomes more bulky as a film further grows and interrupts the smoothness of the film. In this case, even if the n-type semiconductor layer 104 is formed on the pit 103a, the flatness of the layer 104 is interrupted because supply of the precursor material into the deeper part of the pit 103a is reduced and thereby, a pit 104a is produced (refer to FIG. 3). This makes the light emitting characteristic of a device deteriorate similarly to the case of a threading dislocation.

OBJECTS AND SUMMARY OF THE INVENTION

It is an object of the present invention to provide a GaN-based semiconductor light emitting device having a superior light emitting characteristic by reducing the occurrence of a threading dislocation and forming the flat film, and a GaN-based semiconductor light emitting device fabrication method.

A gallium-nitride-based semiconductor light emitting device fabrication method of the present invention is a method for producing the device by forming a film of a nitride semiconductor $(Al_xGa_{1-x})_{1-y}In_yN$ ($0 \leq x \leq 1, 0 \leq y \leq 1$) on a substrate with low-temperature buffer layer by means of accordance with the metal-organic chemical vapor deposition (MOCVD) method, which comprises the underlying layer forming steps of forming an undoped gallium-nitride underlying layer on the low-temperature buffer layer while keeping the pressure in the reactor almost equal to the atmospheric pressure and the flattening step of forming a flattening layer for flattening the surface of the underlying layer.

Moreover, a gallium-nitride-based semiconductor light emitting device of the present invention comprises a structure obtained by forming a nitride semiconductor $(Al_xGa_{1-x})_{1-y}In_yN$ ($0 \leq x \leq 1, 0 \leq y \leq 1$) on a substrate with a low-temperature buffer layer, wherein a underlying layer and a flattening layer containing a Group IV element having a concentration high enough to flatten the surface of the underlying layer are formed on the low-temperature buffer layer.

The threading dislocation density is decreased by forming a GaN underlying layer to be formed on a low-temperature buffer layer while keeping the reactor pressure almost equal to the atmospheric pressure and the number of large pits to be produced is reduced by optimizing a thickness of the GaN underlying layer. Moreover, when an n-type semiconductor layer to be formed on the GaN underlying layer is formed, migration of Ga atoms reaching the plane (0 0 0 1) of the GaN underlying layer is accelerated by containing a group IV element in a source-gas atmosphere, two-dimensional growth is promoted, and pits formed on the GaN underlying layer are smoothed.

DETAILED DESCRIPTION OF THE PREFERRED EMBODIMENT

Figure 1:
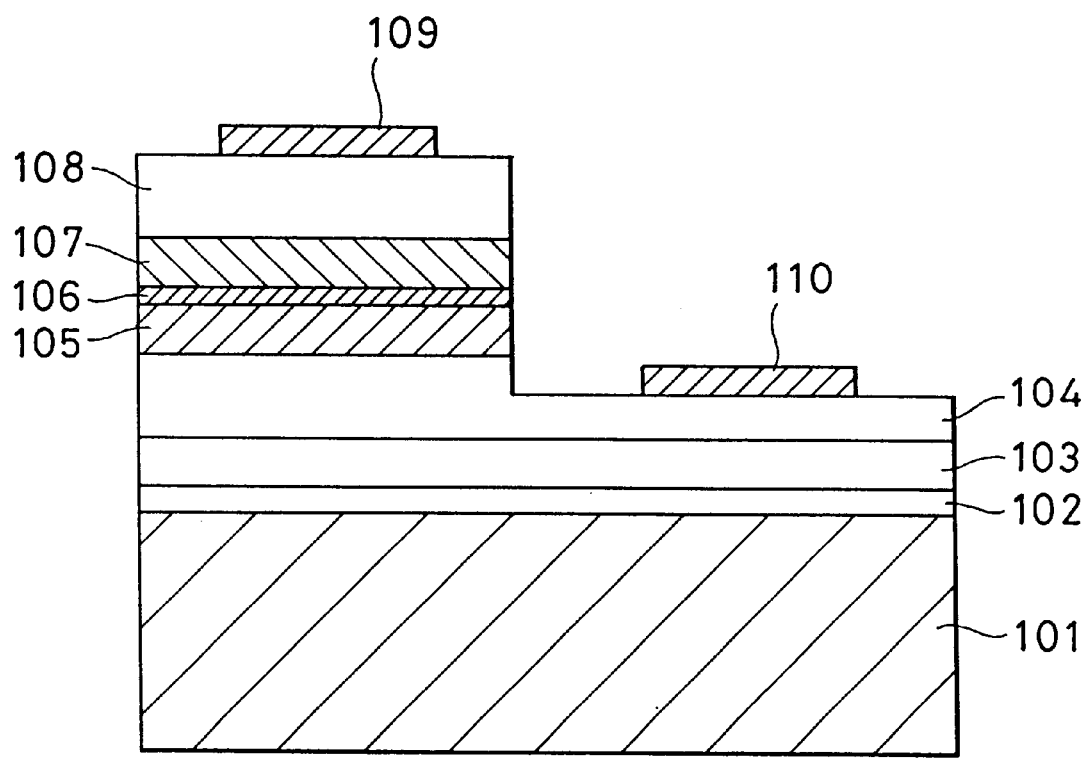
FIG. 1 is a sectional view schematically showing a structure of a conventional nitride-semiconductor light emitting device.
Figure 2:
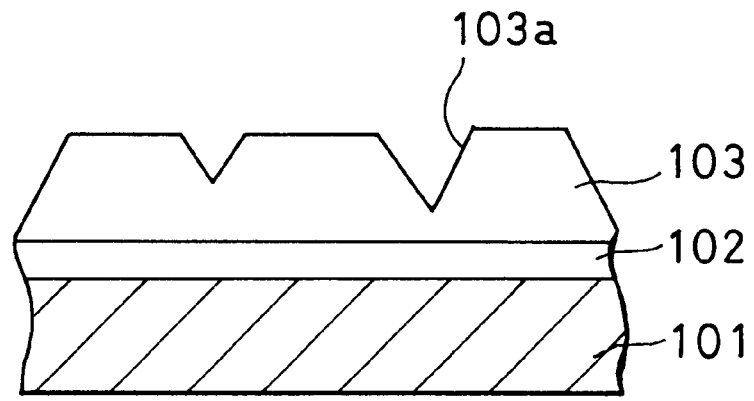
FIG. 2 is a sectional view schematically showing a structure of a substrate in which layers are formed up to a GaN underlying layer.
Figure 3:
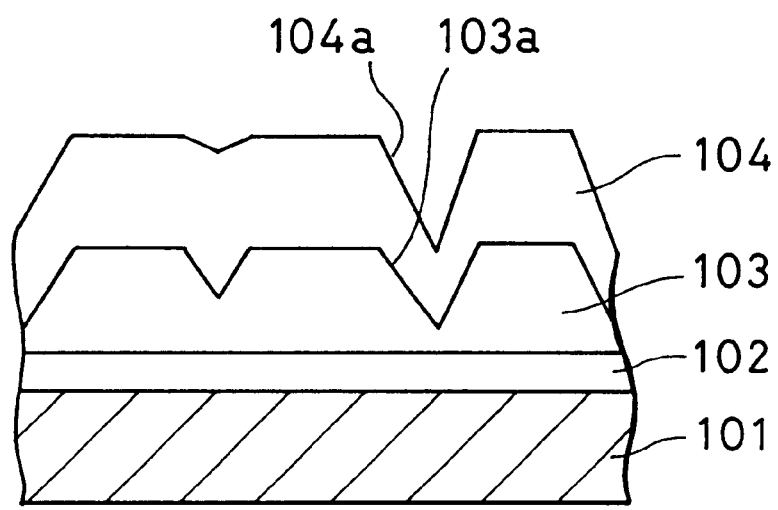
FIG. 3 is a sectional view schematically showing a structure of a substrate in which layers are formed up to an Si:GaN layer.
Figure 4:
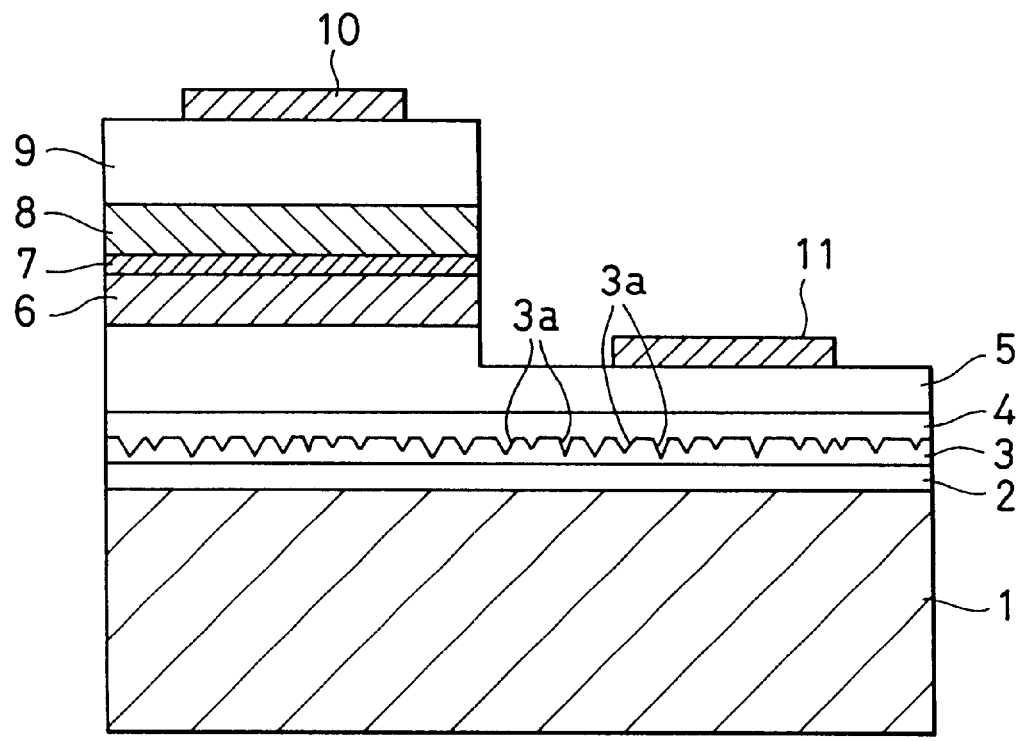
FIG. 4 is a sectional view schematically showing a structure of a nitride-semiconductor light emitting device of the present invention.
Figure 5:
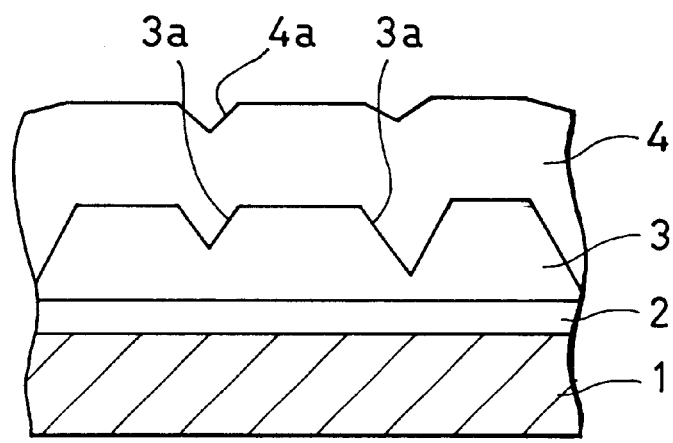
FIG. 5 is a sectional view showing a structure of a substrate in which layers are formed up to an Si:GaN layer of the present invention.

As shown in FIG. 4, a nitride-semiconductor light emitting device of the present invention comprises a multilayer structure obtained by forming a nitride-semiconductor single crystal layer shown by $(Al_xGa_{1-x})_{1-y}In_yN$ ($0 \leq x \leq 1, 0 \leq y \leq 1$) on a substrate 1 made of sapphire. A low-temperature buffer layer 2 made of AlN or GaN is formed on the sapphire substrate 1 in parallel with a plane of the sapphire substrate 1. A GaN underlying layer 3 made of undoped GaN is formed on the low-temperature buffer layer 2. The GaN underlying layer 3 can contain pits 3a. Moreover, an Si:GaN layer 4 doped with Si is formed on the GaN underlying layer 3 and pits 3a formed on the surface of the GaN underlying layer 3 is flattened. As shown in FIG. 5, pits 4a smaller than the pit 3a can be produced on the surface of the Si:GaN layer 4. However, the pits 4a does not influence layers formed on the Si:GaN layer 4 and the pits 4a is permitted as long as it does not deteriorate a light emitting characteristic of an obtained device. Moreover, an n-type semiconductor layer 5, n-type cladding layer 6, active layer 7, p-type cladding layer 8, and p-type contact layer 9 are formed in the stated order. Furthermore, a p-side electrode 10 is formed on the p-type contact layer 9 and an n-type electrode 11 is formed on the n-type semiconductor layer 5 to form a semiconductor light emitting device.

A nitride-semiconductor light emitting device fabrication method of the present invention is described below.

By setting a sapphire substrate 1 in an MOCVD reactor and keeping the substrate 1 in a hydrogen flow having a pressure of 300 Torr at a temperature of 1050° C. for 10 minutes, the surface of the substrate 1 is thermally cleaned by hydrogen. After the thermal cleaning of the surface, the temperature in the reactor is lowered until the temperature of the sapphire substrate becomes 400° C.

Then, $NH_3$ and TMA serving as the precursor materials are introduced into the reactor to react them at 400° C., followed by deposition of a low-temperature buffer layer 2 on the sapphire substrate 1. When the thickness of the low-temperature buffer layer 2 reaches 50 nm, supply of TMA is stopped to raise the pressure in the reactor up to a range of 760±200 Torr, preferably up to 600 Torr while flowing only $NH_3$ through the reactor. At the same time, the temperature in the reactor is raised until the temperature of the substrate 1 reaches 1050° C.

By introducing TMG into the reactor, the GaN underlying layer 3 is formed. The thickness of the GaN underlying layer 3 is controlled in accordance with a film formation time when assuming that the layer 3 uniformly grows on a plane. When the thickness of the GaN underlying layer 3 reaches an average value of 0.3 μm, methyl-silane (hereafter referred to as Me—$SiH_3$) is added into the reactor as an impurity dopant to deposit an Si:GaN layer 4. In this case, a flow rate of Me—$SiH_3$ in the reactor is adjusted so that an Si concentration becomes $1 \times 10^{17}$ ($1/cm^3$) in the deposited Si:GaN layer 4. The Si:GaN layer 4 has a thickness of 2 μm. An n-type semiconductor layer 5, n-type cladding layer 6, active layer 7, p-type cladding layer 8, and p-type contact layer 9 are formed in the stated order on the Si:GaN layer 4 to obtain a GaN-based semiconductor light emitting device. Here, the detailed description is omitted.

It is permitted that the Si:GaN layer 4 is substituted with a GaN layer containing a Group IV element such as Ge. Germane ($GeH_4$) is used for doping with Ge instead of Me—$SiH_3$.

A GaN-based semiconductor light emitting device different in only the thickness of the GaN underlying layer 3 and a GaN-based semiconductor light emitting device different in only the Si concentration in the Si:GaN layer 4 are separately fabricated as comparative examples to compare film properties and light emitting characteristics of the comparative examples with those of a GaN-based semiconductor light emitting device of the present invention.

Figure 6:
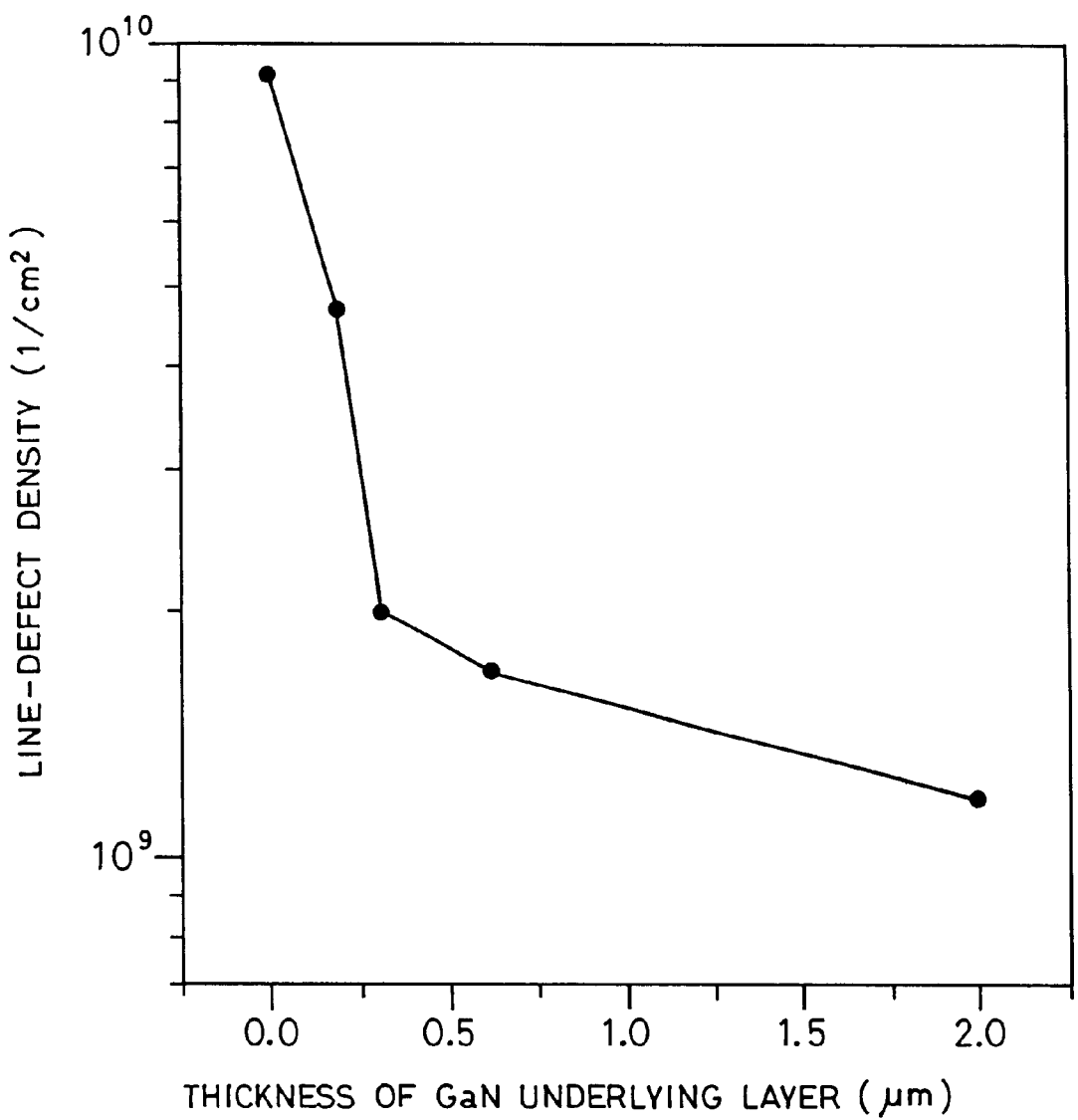
FIG. 6 is a graph showing a relation between GaN underlying layer thickness and threading dislocation density.

As shown in FIG. 6, a threading dislocation density suddenly decreases before the average thickness of the GaN underlying layer 3 reaches 0.3 μm but the decrease rate of the density becomes moderate after the average thickness exceeds 0.3 mm. In this case, the line-defect density when the GaN underlying layer 3 has an average thickness of 0.3 μm is equal to $2 \times 10^9$ (1/cm$^3$). However, as a result of comparing the light emitting efficiency of a light emitting device of the present invention with that of a nitride-semiconductor light emitting device not having the GaN underlying layer 3 but having a line-defect density of $9 \times 10^9$ (1/cm$^3$), it is confirmed that the luminous efficiency of the device of the present invention is approximately five times larger than that of the device not having the GaN underlying layer 3.

Figure 7:
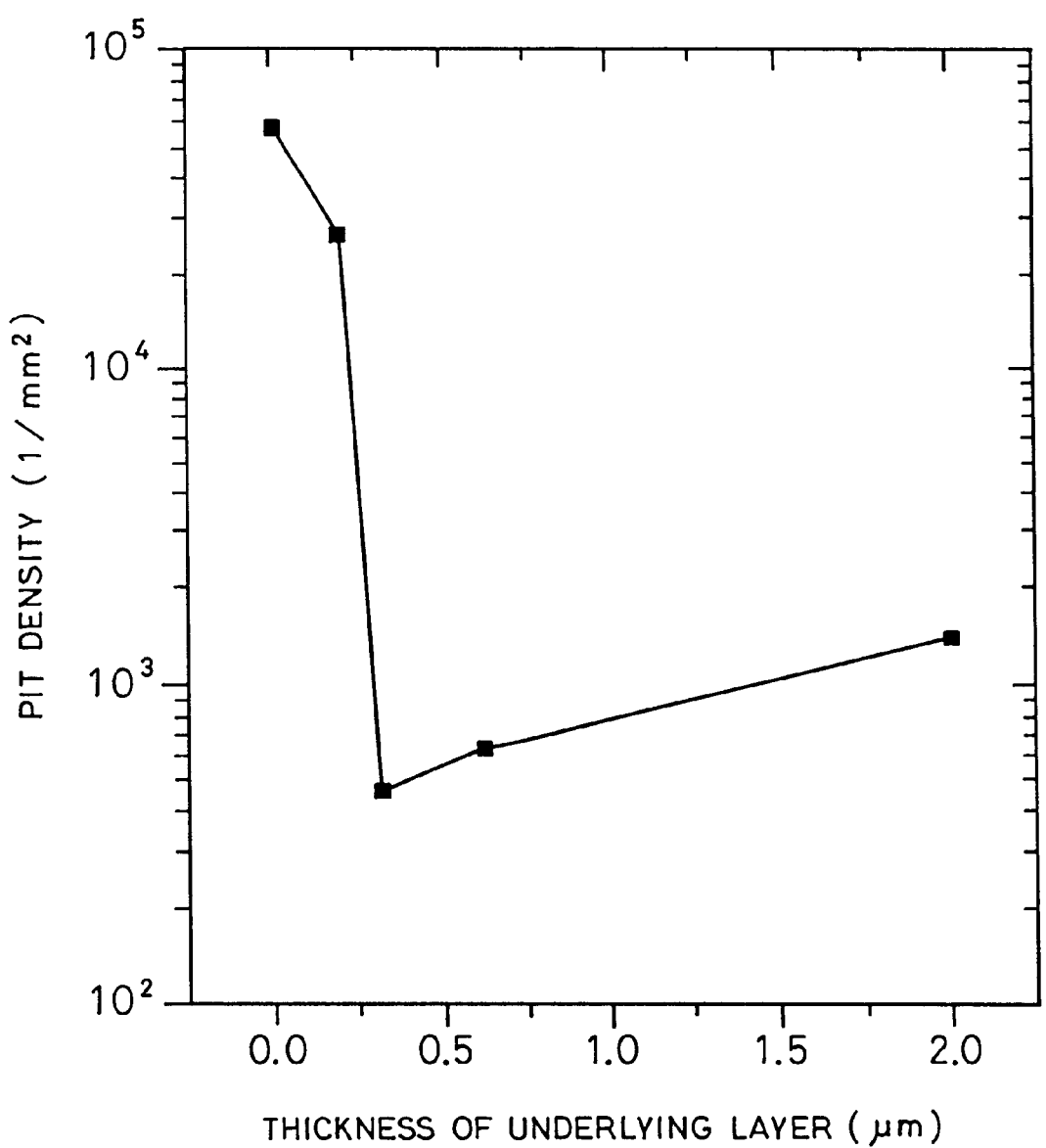
FIG. 7 is a graph showing a relation between GaN underlying layer thickness and pit density.

As shown in FIG. 7, a pit density is minimized when the GaN underlying layer 3 has an average thickness of 0.3 μm. Though not illustrated, a thickness of the GaN underlying layer 3 exceeding 2.0 μm is not preferable because the size of a pit also increases.

Figure 8:
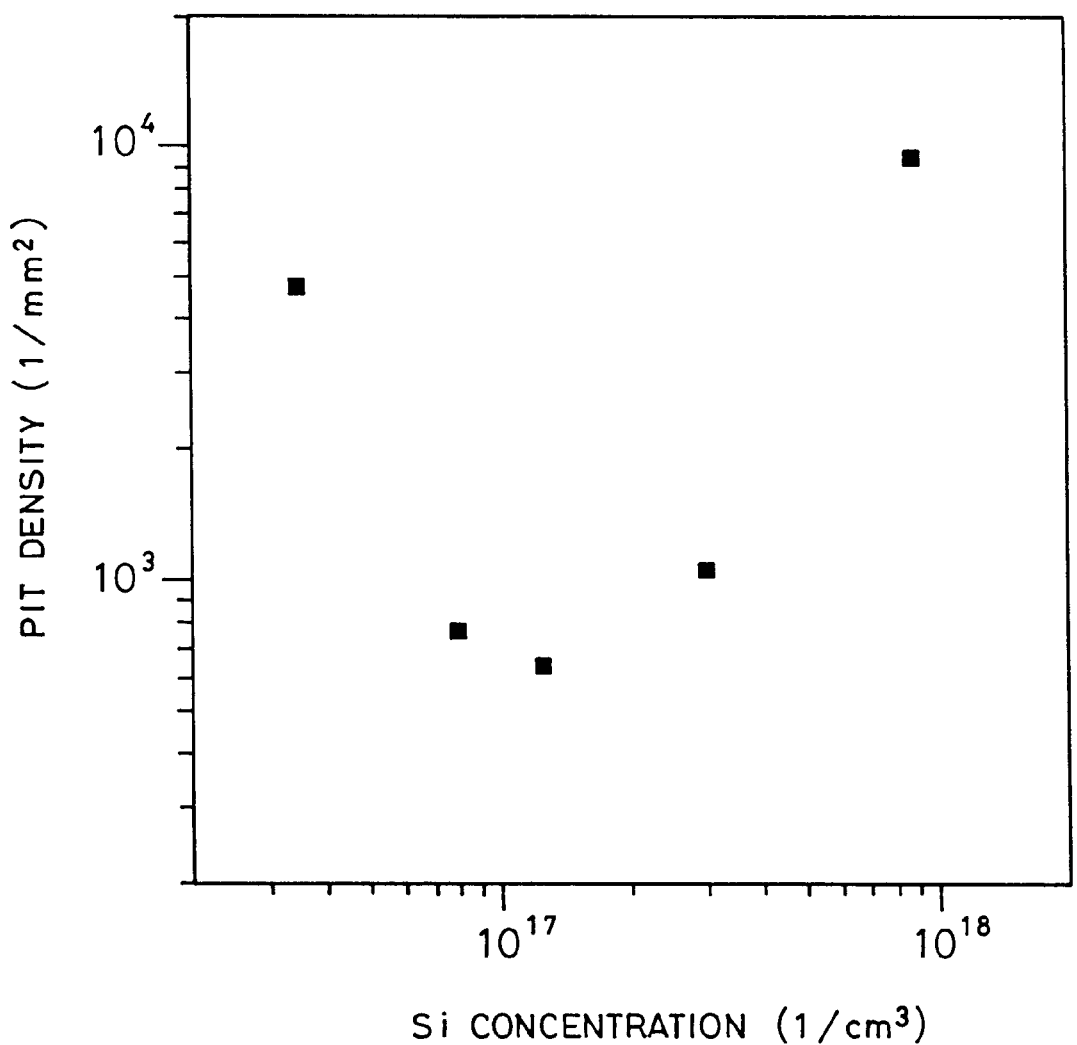
FIG. 8 is a graph showing a relation between Si concentration in an Si:GaN layer and density of pits remaining on the surface of the Si:GaN layer.

As shown in FIG. 8, the density of pits 4a remaining on the Si:GaN layer 4 after the layer 4 is formed on the GaN underlying layer 3 is minimized when an Si concentration in the Si:GaN layer 4 ranges between $5 \times 10^{16}$ and $5 \times 10^{17}$ (1/cm$^3$). That is, formed pits 3a are flattened by the Si:GaN layer 4. In this case, the threading dislocation density when assuming that the GaN underlying layer 3 has an average thickness of 0.3 μm and changing the Si concentration in the Si:GaN layer 4 between $2 \times 10^{17}$ and $9 \times 10^{18}$ (1/cm$^3$) is kept almost constant between $1 \times 10^9$ and $2 \times 10^9$ (1/cm$^3$).

A nitride-semiconductor light emitting device of the present invention is superior to a conventional nitride-semiconductor light emitting device in light emitting characteristics including luminous brightness.

According to the present invention, it is possible to reduce the density of threading dislocation included in a semiconductor multilayer of a GaN-based semiconductor light emitting device and keep the flatness of a film. Therefore, an obtained GaN-based semiconductor light emitting device is superior in light emitting characteristics including luminous brightness.

What is claimed is:

1. A gallium-nitride-based semiconductor light emitting device comprising a structure in which a nitride semiconductor $(Al_xGa_{1-x})_{1-y}In_yN$ ($0 \leq x \leq 1$, $0 \leq y \leq 1$) is formed on a substrate, wherein the device comprises:
    a low-temperature buffer layer formed on the substrate;
    an underlying layer; and
    a GaN flattening layer containing a group IV element having a concentration in a range of $5 \times 10^{16}$ to $5 \times 10^{17}$ 1/cm$^3$,
    wherein the underlying layer is formed between the flattening layer and the low-temperature buffer layer.

2. A gallium-nitride-based semiconductor light emitting device according to claim 1, wherein the underlying layer has an average thickness of at least 0.3 μm.

3. The gallium-nitride-based semiconductor light emitting device according to claim 1, wherein the group IV element is silicon.

4. A gallium-nitride-based semiconductor light emitting device according to claim 3, wherein the underlying layer has an average thickness of at least 0.3 μm.

5. The gallium-nitride-based semiconductor light emitting device according to claim 3, wherein the flattening layer contain silicon having concentration in a range of $5 \times 10^{16}$ to $5 \times 10^{17}$ (1/cm$^3$).

6. A gallium-nitride-based semiconductor light emitting device according to claim 5, wherein the underlying layer has an average thickness of at least 0.3 μm.

7. The gallium-nitride-based semiconductor light emitting device according to claim 1, wherein the group IV element is germanium.

8. A gallium-nitride-based semiconductor light emitting device according to claim 7, wherein the underlying layer has an average thickness of at least 0.3 μm.

9. The gallium-nitride-based semiconductor light emitting device according to claim 1, further comprising:
    an n-type semiconductor layer formed on said flattening layer.

10. The gallium-nitride-based semiconductor light emitting device according to claim 1, wherein the nitride semiconductor $(Al_xGa_{1-x})_{1-y}In_yN$ ($0 \leq x \leq 1$, $0 \leq y \leq 1$) is formed on the flattening layer.

11. A gallium-nitride-based semiconductor light emitting device, comprising:
    a substrate;
    a low-temperature buffer layer which is formed on said substrate;
    an underlying layer which is formed on said low-temperature buffer layer;
    a GaN flattening layer containing a group IV element having a concentration in a range of $5 \times 10^{16}$ to $5 \times 10^{17}$ 1/cm$^3$; and
    a n-type layer which is formed on said flattening layer.

12. The gallium-nitride-based semiconductor light emitting device according to claim 11, wherein said low-temperature buffer layer comprises gallium and nitride.

13. The gallium-nitride-based semiconductor light emitting device according to claim 11, wherein said low-temperature buffer layer comprises aluminum and nitride.

14. The gallium-nitride-based semiconductor light emitting device according to claim 11, wherein said underlying layer comprises gallium and nitride.

15. The gallium-nitride-based semiconductor light emitting device according to claim 11, wherein said flattening layer is Si-doped gallium nitride.

16. The gallium-nitride-based semiconductor light emitting device according to claim 11, wherein said flattening layer contains silicon having a concentration in a range of $5 \times 10^{16}$ to $5 \times 10^{17}$ (1/cm$^3$).

17. The gallium-nitride-based semiconductor light emitting device according to claim 11, wherein said n-type layer contains silicon having a concentration more than $1 \times 10^{18}$ (1/cm$^3$).

* * * * *